US006438360B1

United States Patent
Alberth, Jr. et al.

(10) Patent No.: US 6,438,360 B1
(45) Date of Patent: Aug. 20, 2002

(54) AMPLIFIER SYSTEM WITH LOAD CONTROL TO PRODUCE AN AMPLITUDE ENVELOPE

(75) Inventors: William P. Alberth, Jr., Crystal Lake; Armin Klomsdorf, Spring Grove; Luke Winkelmann, Mundelein, all of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/359,280

(22) Filed: Jul. 22, 1999

(51) Int. Cl.[7] .................................................. H04B 1/04

(52) U.S. Cl. ....................................... 455/110; 330/129

(58) Field of Search ............................. 455/73, 74, 91, 455/107, 110, 126, 127, 129; 330/86, 127, 129, 133, 149, 136, 284, 144

(56) References Cited

U.S. PATENT DOCUMENTS

| | | | |
|---|---|---|---|
| 3,678,403 A | * | 7/1972 | Craft ........................... 330/13 |
| 3,693,088 A | * | 9/1972 | Rustako, Jr. et al. ....... 455/506 |
| 4,041,395 A | | 8/1977 | Hill |
| 4,147,985 A | | 4/1979 | Rogers |
| 4,163,994 A | * | 8/1979 | Sakamoto et al. ............ 360/70 |
| 4,165,493 A | | 8/1979 | Harrington |
| 4,348,644 A | | 9/1982 | Kamiya |
| 4,356,458 A | | 10/1982 | Armitage |
| 4,370,622 A | | 1/1983 | Hornbeck et al. |
| 4,403,194 A | * | 9/1983 | Talbot ......................... 329/146 |
| 4,442,407 A | | 4/1984 | Apel |
| 4,540,953 A | * | 9/1985 | Togari et al. ................ 330/284 |
| 4,546,313 A | | 10/1985 | Moyer |
| 4,647,871 A | | 3/1987 | Turner, Jr. |
| 4,827,219 A | | 5/1989 | Harrison |
| 4,890,062 A | | 12/1989 | Haragashira |
| 4,924,191 A | | 5/1990 | Erb et al. |
| 4,985,686 A | | 1/1991 | Davidson et al. |
| 4,990,866 A | | 2/1991 | Martheli |
| 4,994,757 A | | 2/1991 | Bickley et al. |
| 5,060,294 A | | 10/1991 | Schwent et al. |
| 5,101,172 A | | 3/1992 | Ikeda et al. |
| 5,113,414 A | | 5/1992 | Karam et al. |
| 5,170,496 A | | 12/1992 | Viereck |
| 5,195,045 A | | 3/1993 | Keane et al. |
| 5,220,276 A | | 6/1993 | Kleefstra |
| 5,251,330 A | | 10/1993 | Chiba et al. |
| 5,276,912 A | | 1/1994 | Siwiak et al. |
| 5,278,997 A | | 1/1994 | Martin |
| 5,300,894 A | | 4/1994 | Myer et al. |
| 5,302,914 A | | 4/1994 | Arntz et al. |
| 5,329,244 A | | 7/1994 | Fujita et al. |
| 5,339,041 A | | 8/1994 | Nitardy |
| 5,351,016 A | | 9/1994 | Dent |
| 5,361,403 A | | 11/1994 | Dent |
| 5,408,691 A | | 4/1995 | Takao |
| 5,420,536 A | | 5/1995 | Faulkner et al. |
| 5,428,828 A | | 6/1995 | Pugel et al. |
| 5,483,680 A | | 1/1996 | Talbot |

(List continued on next page.)

FOREIGN PATENT DOCUMENTS

EP 0685936 A2 6/1995

*Primary Examiner*—Dwayne Bost
*Assistant Examiner*—Joy K. Contee
(74) *Attorney, Agent, or Firm*—Paul J. Bartusiak; Randall S. Vaas

(57) ABSTRACT

An amplifier system to increase the efficiency of amplification systems that employ linear modulation schemes. The amplifier system has a signal amplifier for receiving a constant amplitude input signal and producing an amplified version of the input signal. A variable impedance network presents various impedances to an output of the signal amplifier responsive to a load control signal. An envelope mapping circuit coupled to the variable impedance network produces the load control signal responsive to a desired amplitude modulation (AM) envelope. The various impedances causes the desired AM envelope to be impressed upon the amplified version of the input signal.

20 Claims, 6 Drawing Sheets

U.S. PATENT DOCUMENTS

| | | |
|---|---|---|
| 5,564,086 A | 10/1996 | Cygan et al. |
| 5,589,796 A | 12/1996 | Alberth, Jr. et al. |
| 5,598,127 A | 1/1997 | Abbiati et al. |
| 5,640,691 A | 6/1997 | Davis et al. |
| 5,673,001 A | 9/1997 | Kim et al. |
| 5,724,003 A * | 3/1998 | Jensen et al. ............... 330/129 |
| 5,742,201 A | 4/1998 | Eisenberg et al. |
| 5,842,140 A * | 11/1998 | Dent et al. .................. 455/573 |
| 6,141,541 A * | 10/2000 | Midya et al. ................. 455/91 |

\* cited by examiner

AMPLIFIER SYSTEM WITH LOAD CONTROL TO PRODUCE AN AMPLITUDE ENVELOPE

CROSS REFERENCE TO RELATED APPLICATION

This application is related to co-pending U.S. patent applications Ser. No. 09/359,586 filed herewith by Alberth et al. and entitled "LOAD ENVELOPE FOLLOWING AMPLIFIER SYSTEM," Ser. No. 09/359,225 filed herewith by David Schlueter and entitled "POWER AMPLIFYING CIRCUIT WITH SUPPLY ADJUST TO CONTROL ADJACENT AND ALTERNATE CHANNEL POWER," Ser. No. 09/358,674 filed herewith by Klomsdorf et al. and entitled "MEMORY-BASED AMPLIFIER LOAD ADJUST SYSTEM," and Ser. No. 09/358,884 filed herewith by Klomsdorf et al. and entitled "POWER AMPLIFYING CIRCUIT WITH LOAD ADJUST FOR CONTROL OF ADJACENT AND ALTERNATE CHANNEL POWER."

FIELD OF THE INVENTION

This invention generally relates to a high efficiency power amplifier system. More specifically, this invention relates to an amplifier system with load control for efficient amplification in a linear modulation scheme.

BACKGROUND OF THE INVENTION

The rapid and great increase in the cellular phone use has resulted in a shortage of frequency spectrum for handling all of the cellular customers. This shortage has prompted a migration towards more spectrally efficient, digital modulation schemes that have higher user capacities. Examples of such modulation schemes include Interim Standard (IS)-136 Time Division Multiple Access (TDMA), Personal Digital Cellular, IS-95 based Code Division Multiple Access, Global System for Mobile communications (GSM) and TDMA Edge. In addition, newer and even higher data rate capacity systems are being proposed and developed for third generation cellular systems.

The digital cellular systems usually require linear modulation, and while the linear modulation does facilitate higher system capacity, it also results in lower efficiency power amplifiers. Power amplifiers continue to consume a significant percentage of the overall current drain of the portable radiotelephones used in cellular communication systems. The higher the current drain, the less talk time and stand-by time that is available, since the battery for the portable radiotelephone will be drained faster. Thus, the efficiency of the power amplifiers used in portable radiotelephones is a critical parameter; the higher the efficiency, the less current the power amplifier consumes and the more talk/stand-by time is available for the portable radiotelephone. Several techniques have been proposed to improve the efficiency of power amplifiers linear modulation systems.

One technique for improving the efficiency of power amplifiers is Envelope Elimination and Restoration (EER). EER was first proposed by Leonard Kahn in 1952 (July Proceedings of the I.R.E. page 803–806). An example block diagram of a power amplifier (PA) EER system is depicted in FIG. 1. The PA EER system 100 includes a limiter 2 coupled to a power amplifier 4, and the power amplifier 4 coupled to antenna 14. The PA EER system 100 further includes a voltage supply control circuit 6 coupled to the power amplifier 4 through a filter 8.

In a many digital cellular systems, the information bearing radio frequency signal contains both amplitude modulation (AM) and phase modulation (PM) components. An RF signal with AM and PM components appearing at input 12 is processed by the limiter 2. The limiter 2 removes all AM information and passes a substantially constant envelope signal to the power amplifier 4. The limiter can be a simple limiting RF amplifier.

In addition, an envelope signal appearing at input 16 contains information about the RF signal envelope of the RF signal that appears at input 12. The envelope signal is applied to the voltage supply control circuit 6. Finally, a substantially constant supply voltage is applied to the voltage supply control circuit 6 at input 10. The voltage supply control circuit 6 along with filter 8 comprises a switching power supply that modulates the supply voltage appearing at input 10 in response to the envelope signal appearing at input 16. The voltage supply control circuit 6 and the filter 8 thus supply a varying voltage signal on line 18 that varies according to the AM envelope of the RF signal originally appearing at input 12. By modulating the supply voltage to the power amplifier, the desired AM envelope is impressed on the output signal of the power amplifier, and the resultant signal with the restored AM envelope is transmitted through antenna 14. Since the AM of the RF input signal appearing at input 12 is removed, the PA EER system 100 allows the power amplifier 4 to operate as a very efficient class C amplifier. All of the AM information is impressed upon the output signal of the power amplifier by the changes in the power amplifier supply voltage appearing on line 18.

There are several difficulties and shortcomings of the PA EER system 100. First, limiters that sufficiently remove the AM of the RF input signal are difficult to realize. The difficulty increases as the operating frequency increases. Second, the voltage supply control circuit 6 and the filter 8 are substantially a switching power supply. These circuits typically consume much power that ultimately factors into and subtracts from the overall efficiency of the PA EER system. Third, it is difficult to develop a voltage supply control circuit 6 that meets the bandwidth requirements necessary for the voltage supply control circuit 6 to follow the AM evelope of wide band systems such as code division multiple access (CDMA) cellular telephone systems. For example, the envelope signal appearing at input 16 is generated by decomposing the RF signal appearing at input 12 into separate AM and PM signals. The decomposed AM signal has significantly higher bandwidth than the composite signal, and the voltage supply control must operate at the bandwidth of the decomposed AM signal. For many of the third generation cellular systems, switching speeds in the range of approximately 20 MHz could be required for such a PA EER system. And finally, the PA EER system 100 is expensive to produce. The filter 8 requires several components including at least one large inductor. These parts tend to add considerable cost and size to the portable radiotelephone, and since portable radiotelephones is many times a commodity product, price is a critical parameter.

Another technique for improving the efficiency of power amplifiers is called Envelope Following (EF). A simplified block diagram of an EF system is shown in FIG. 2. The PA EF system 200 includes a power amplifier 30 coupled to antenna 40 in the RF path and a voltage supply control circuit 32 coupled through filter 34 to the power amplifier 30 on the supply path.

An RF signal having AM and PM modulation components appearing at input 38 is applied to the power amplifier 30. In addition, an envelope signal containing information about the AM envelope of the RF signal at input 38 is applied through input 42 to the voltage supply control circuit 32. Once again, the voltage supply control circuit 32 and the filter 34 are in essence a switching power supply. A substantially constant supply voltage is applied to the voltage supply control circuit 32 through input 36.

In this system, the AM is not removed from the RF signal appearing at input 38. Rather, the supply voltage supplied to the PA 30 through line 44 is reduced or increased responsive to the amplitude of the AM envelope. The supply voltage applied to the power amplifier 30 thus follows the AM envelope of the RF signal applied to the power amplifier 30. By modulating the supply voltage to the power amplifier 30 to follow the AM envelope, less power is consumed overall. For example, when the envelope is at a peak, the supply voltage to the power amplifier 30 is increased, but when the envelope is at a minimum, the supply voltage decreases, thereby saving power. This significantly increases the efficiency of the power amplifier 30.

Since the actual AM on the output signal produced by the power amplifier 30 does not originate in the voltage supply control circuit 32, some of the bandwidth requirements on the voltage supply control circuit 32 and filter 34 are reduced relative to the PA EER 100. This system also eliminates the need for a high frequency limiter. However, PA EF system 200 still requires a voltage supply control circuit 32 and filter 34, which adds significant cost and size to a portable radiotelephone.

Accordingly, there is a need for power amplifier systems operable in linear modulation systems. There is a further need for these linear power amplifier systems to be efficient so as to minimize current drain for operation in portable radiotelephones. There is a further need to minimize the cost of producing linear power amplifier systems in order to make the portable radiotelephones that utilize the power amplifier systems price competitive.

DETAILED DESCRIPTION OF PREFERRED EMBODIMENTS

Figure 1:
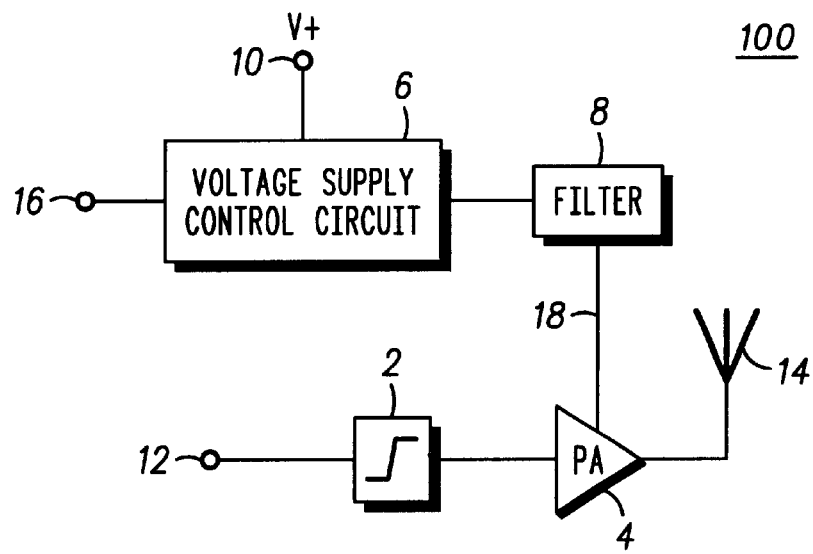
FIG. 1 is a block diagram of a prior art envelope elimination and restoration (EER) system.
Figure 2:
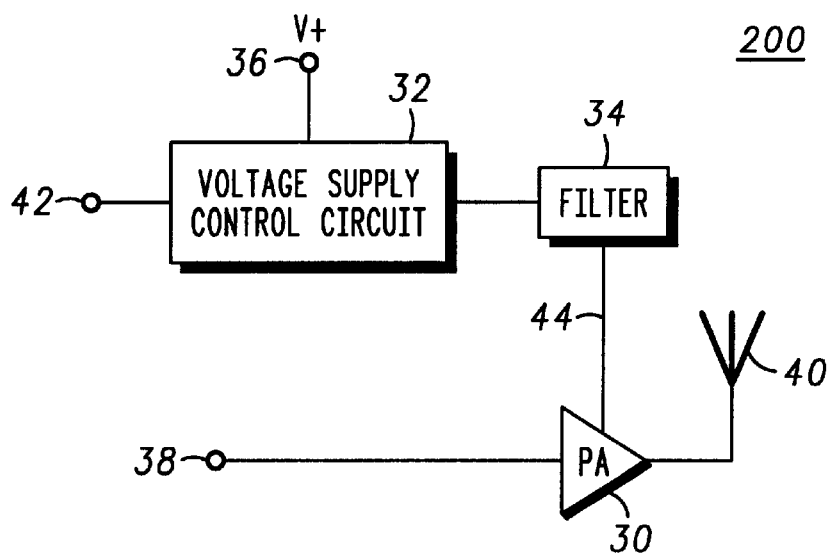
FIG. 2 is a block diagram of a prior art envelope following (EF) system.
Figure 3:
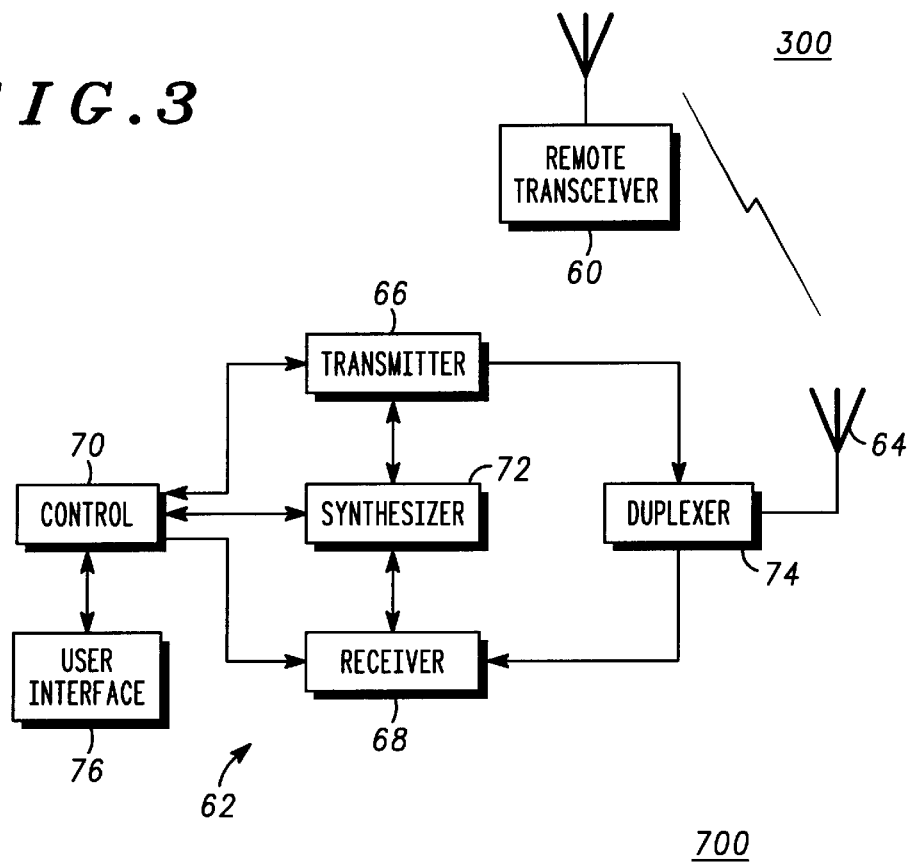
FIG. 3 is a block diagram of a radiotelephone having a receiver and a transmitter.

FIG. 3 is an illustration in block diagram form of a radiotelephone communication system 300. The radiotelephone communication system 300 includes a remote transceiver 60 and one or more radiotelephones such as radiotelephone 62. The remote transceiver 60 sends and receives RF signals to and from the radiotelephone 62 within a designated geographic area.

The radiotelephone 62 includes an antenna 64, a transmitter 66 (also referred to as a radio frequency transmitter), a receiver 68, a control block 70, a synthesizer 72, a duplexer 74, and a user interface 76. To receive information, the radiotelephone 62 detects RF signals containing data through the antenna 64 and produces detected RF signals. The receiver 68 converts the detected RF signals into electrical baseband signals, demodulates the electrical baseband signals, recovers the data, including automatic frequency control information, and outputs the data to the control block 70. The control block 70 formats the data into recognizable voice or data information for use by the user interface 76. Typically the user interface 76 includes a microphone, a speaker, a display, and a keypad, and the user interface 76 is for receiving user input information and presenting received data that was transmitted by remote transceiver 60. The receiver includes circuitry such as low noise amplifiers, filters, down conversion mixers and quadrature mixers, and automatic gain control circuitry, all known in the art.

To transmit RF signals containing information from the radiotelephone 62 to the remote transceiver 60, the user interface 76 directs user input data to the control block 70. The control block 70 typically includes any of a DSP core, a microcontroller core, memory, clock generation circuitry, software, and a power amplifier control circuit. The control block 70 formats the information obtained from the user interface 76 and conveys it to the transmitter 66 for conversion into RF modulated signals. The transmitter 66 conveys the RF modulated signals to the antenna 64 for transmission to the remote transceiver 60. Thus, the transmitter 66, also referred to as an RF transmitter, is for transmitting a modulated information signal. The duplexer provides isolation between the signals transmitted by the transmitter 66 and received by the receiver 68.

The synthesizer 72 provides the receiver 68 and the transmitter 66 with signals, tuned to the proper frequency, to allow the reception and transmission of information signals. Control over functions of the receiver 68 and the transmitter 66, such as channel frequency, is provided by the control block 70. Thus, the control block 70 provides the synthesizer 72 program instructions for frequency synthesis.

Figure 4:
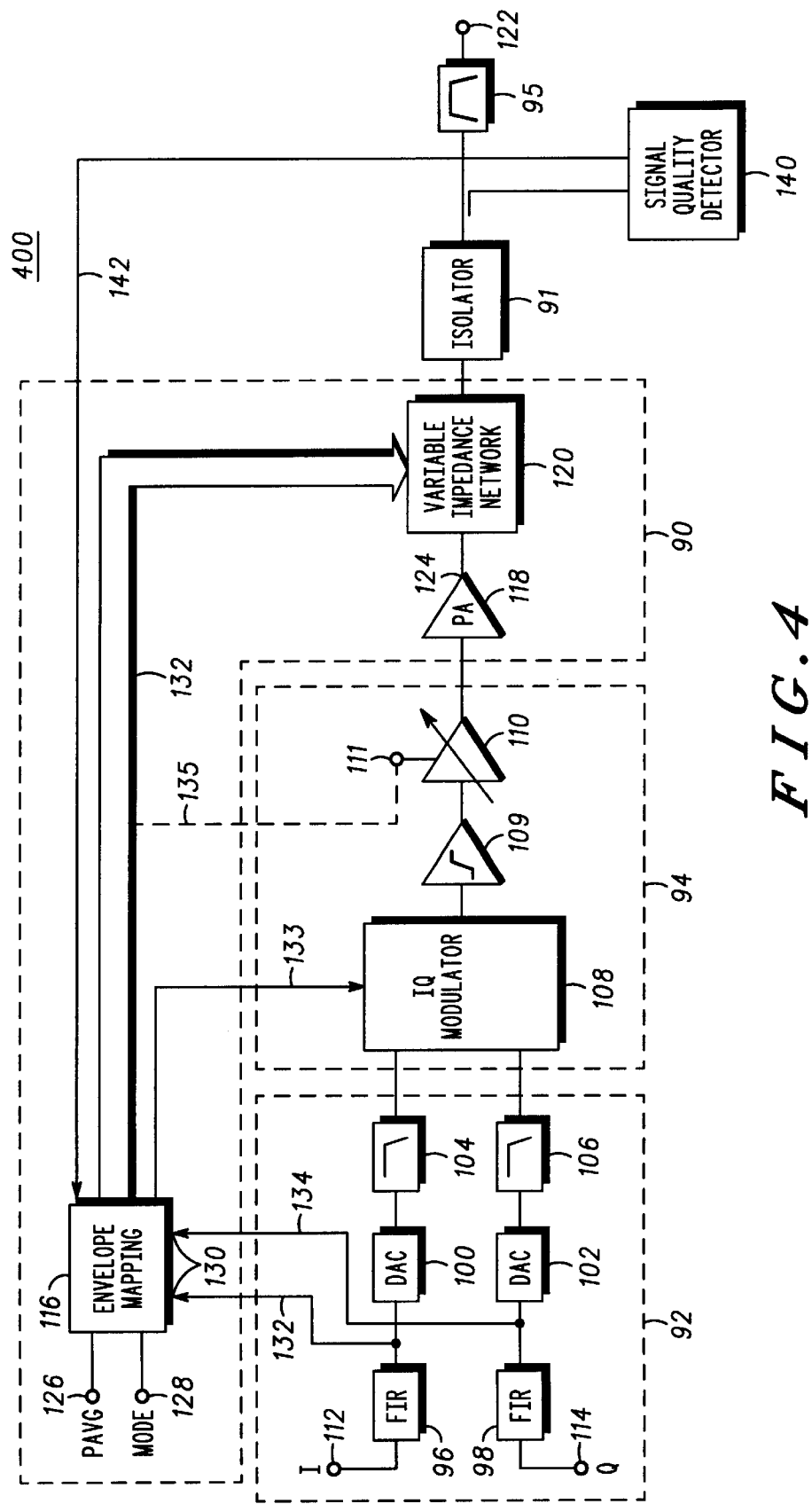
FIG. 4 is a block diagram of one embodiment of the amplifier system for use in the transmitter of FIG. 3.

FIG. 4 is a block diagram of a transmitter that can be used for the radiotelephone 62. The transmitter 400 employs an amplifier system 90 for efficient operation in a linear modulation scheme.

In FIG. 4, the transmitter 400 is partitioned into base-band circuitry 92, radio frequency (RF) circuitry 94, the amplifier system 90, and a filter 95. The base-band circuitry 92 and the RF circuitry 94 can be collectively referred to as transmitter circuitry. The filter 95 is of conventional design and may alternatively be incorporated into the duplexer 74 (FIG. 3).

The base-band circuitry 92 includes a first finite impulse response (FIR) filter 96, a second FIR filter 98, a first digital-to-analog (DAC) converter 100, a second DAC 102, a first anti-alias filter 104, and a second anti-alias filter 106. All of the circuits shown as the baseband circuitry 92 in FIG.

4 are of conventional design. Other configurations of the baseband circuitry 92 can be utilized without the use of the inventive faculty. Further, at least a portion of the baseband circuitry can be realized using circuitry within the control block 70 of FIG. 3.

The RF circuitry 94 includes an in-phase and quadrature phase (IQ) modulator 108 coupled to an amplitude limiting element, here limiting amplifier 109. The limiting amplifier 109 is coupled to a variable gain element, here variable gain amplifier (VGA) 110. Additional amplification stages can be inserted before or after the VGA 110.

The IQ modulator contains a mixer pair that receives an in-phase baseband signal (I) appearing at first baseband input 112, a quadrature-phase baseband signal (Q) appearing at second baseband input 114, an in-phase intermediate frequency (IF) carrier signal (not shown), and a quadrature phase IF carrier signal (not shown). The IQ modulator also contains an up-conversion mixer coupled to the mixer pair for converting the IF modulated signal to an RF signal. The IQ modulator 108, the limiting amplifier 109, and the VGA 110 are also of conventional design.

The amplifier system 90 includes an envelope mapping circuit 116, a power amplifier 118, and a variable impedance network 120. The power amplifier 118 can be a single stage amplifier or a multi-stage amplifier.

The path from the first baseband input 112 and the second baseband input 114 to the RF output 122 is typically referred to as the RF path. Modifications and/or additions to the RF path can be made. For example, in the illustrated embodiment an upconversion mixer with associated IF filters are included in the RF path (e.g. within the IQ modulator 108) for frequency selectivity. Alternatively, the IQ modulator can convert baseband signals directly to the transmit RF, thereby forming a direct launch transmitter.

Circuitry within the control block 70 (FIG. 3) converts user input to a digital I and Q signal that are applied to the first baseband input 112 and the second baseband input 114, respectively. The first FIR filter 96 and the second FIR filter 98 filters the I and Q signals to reduce the inter-symbol interference that would otherwise result from transmission over a transmission channel/medium. The first DAC 100 and the second DAC 102 convert the digital I and Q signals into I and Q analog signals. First anti-alias filter 104 and second anti-alias filter 106 filter the I and Q analog signals as is known in the art.

The IQ modulator 108 receives the I and Q analog signals, and quadrature modulates them to an IF modulated signal. An up-conversion mixer within the IQ modulator 108 then converts the IF modulated signal to an RF modulated signal. Both the IF modulated signal and the RF modulated signals typically contain amplitude modulation (AM) envelope and phase modulation (PM) in accordance with the modulation scheme utilized.

The RF modulated signal is applied to the limiting amplifier 109. The limiting amplifier 109 removes the AM envelope from the RF modulated signal to provide an amplitude limited signal to the VGA 110.

Alternatively, the amplitude limited signal can be generated by circuitry prior to the limiting amplifier 109 so that the limiting amplifier 109 is not needed. For example, the I and Q signals can be modified prior to applying them to the IQ modulator 108 so that the IQ modulator 108 produces a constant envelope signal as is known in the art. The combination of a circuit block for limiting the signal amplitude with the amplifier system 90 can be referred to as a power amplifier envelope elimination and restoration (PA LEER) system.

Furthermore, in another alternate embodiment the IQ modulator 108 only strips a portion of the AM envelope to produce a partially limited signal. This reduces the dynamic range of the variable impedance network 120.

In addition, average transmit power control circuitry (not shown) is coupled to the control block 70 (FIG. 3), the transmitter circuitry, and the amplifier system 90 (FIG. 4). The average transmit power control circuitry is for generating an automatic output control (AOC) signal as is known in the art. In the illustrated embodiment, the control block 70 contains the average transmit power control circuitry. The VGA 110 receives at VGA control input 111 the AOC signal for setting the gain of the VGA 110. By varying the gain of the VGA 110, the radiotelephone 62 can vary its average transmitted output power (and thus the average amplitude of the amplitude limited signal).

The VGA 110 can be a multi-stage variable gain amplifier so that several stages of gain can be altered. The multiple stages of variable gain amplification can also be distributed along different portions of the transmit path. Further, at least some of the necessary variable gain can be achieved through the use of a variable attenuator rather than a variable gain amplifier as is know in the art.

The control block 70 can generate the AOC signal in response to radiotelephone 62 making received signal strength measurements (e.g. open loop power control). The remote transceiver 60 can also send the radiotelephone 62 a power control command, and the control block 70 generates the AOC signal at least in part responsive to the remote transceiver 60 power control command (e.g. IS-95 CDMA closed loop power control). In addition, the control block 70 can generate the AOC signal using a combination of open loop and closed loop power control.

The RF signal produced by the VGA 110 is coupled to a buffer amplifier (not shown) for signal amplification. This amplifier increases the maximum gain through the RF path so that a maximum necessary output power can be achieved when necessary. The buffered signal is still an amplitude limited signal.

The buffered signal is coupled to the power amplifier 118 as a power amplifier input signal. The power amplifier 118 produces an amplified version of the power amplifier input signal at power amplifier output 124. The supply voltage (not shown) applied to the power amplifier 118 is substantially constant in that the power amplifier supply voltage is not purposely varied in response the AM envelope. Thus, the power amplifier 118 is biased to provide maximum efficiency to amplify the amplitude limited signal.

With the substantially constant bias applied to the power amplifier 118, the variable impedance network 120 provides a variable load impedance to the power amplifier output 124. By varying the impedance presented to the power amplifier output 124, the output power of the power amplifier can be varied. This is because the output power of a power amplifier can be made to vary inversely with the load impedance presented to the output of the power amplifier.

An example of the output power of a power amplifier being varied by the load impedance is disclosed in U.S. Pat. No. 5,276,912. Though the U.S. Pat. No. 5,276,912 patent focused on real rather than complex load impedances, if the proper load phase is selected for various power levels, superior efficiency can be maintained.

Thus, the power amplifier 118 can operate in saturation to amplify an amplitude limited signal, thereby maximizing the efficiency of the power amplifier. By continuously varying the load impedance presented to the power amplifier output 124, the AM envelope can be restored to the signal appearing at the power amplifier output 124.

Envelope mapping circuit 116 is a signal processor and can be realized with, for example, a DSP or an application specific integrated circuit (ASIC). Envelope mapping circuit technology is generally known to those skilled in the art. An example of an envelope mapping circuit is described in U.S. Pat. No. 5,420,536. Other envelope mapping circuit implementations can be utilized as is known in the art.

An average power level signal generated by the control block 70 (FIG. 3), designated $P_{AVG}$ in FIG. 4, is applied to power level input 126. The average power level signal contains information as to the desired transmit power level and is thus a derivative of the AOC signal.

The average power level signal is used by the envelope mapping circuit 116 for a mapping process. For a particular output power level, there exists an optimum output impedance for the power amplifier 188 to have the highest efficiency. When the transmit power level is changed by varying the gain of the VGA 110, a different optimum impedance must be presented to the power amplifier output 124. Thus, the envelope mapping circuit 116 must produce a load control signal on bus 132 responsive not only to the I and Q signals, but also responsive to the average transmit power level.

For example, when the radiotelephone 62 is used for an IS-95 code division multiple access (CDMA) cellular telephone system, the average transmit power must vary from −50 dBm to +24 dBm in 1 dB steps. This dynamic range is achieved at least in part by the VGA 110. However, because of the OQPSK modulation in IS-95, the transmitted signal has an AM envelope with an amplitude that varies from −40 dB to 5.6 dB, with 0 dB variance being the median output level for a particular average output power setting. Thus, if the transmit power level is set to 24 dBm, the amplitude of the modulation envelope varies from −16 dBm to 29.6 dBm. A group of settings are contained in the envelope mapping circuit 116 so that the load control signal can adjust the variable impedance network 120 in response to the I and Q values detected on lines 132 and 134, respectively. These settings are specific to detected I and Q values when the transmit power level is 24 dBm.

When a different average transmit power is selected, such as −50 dBm, the average power level signal appearing at power level input 126 reflects this change. With the OQPSK modulation, the transmitted signal now has an AM envelope with an amplitude that varies from −90 dBm to −44.4 dBm. The envelop mapping circuit 116 now produces a load control signal on bus 132 to adjust the variable impedance network 120 responsive to the amplitude and phase of the I/Q signals and the new transmit power level.

The control block 70 (FIG. 3) also generates a mode signal that is applied to the mode input 128 of the envelope mapping circuit 116. The mode signal is for selecting the mode of operation of the transmitter 400. For example, the radiotelephone 62 can be a multi-mode phone operable in a CDMA mode and an AMPS mode. The mode signal causes the envelope mapping circuit 116 to produce the load control signal on bus 132 that causes the variable impedance network 120 to operate in accordance with the particular mode that the radiotelephone 62 is operating in.

If the radiotelephone 62 is operating in the AMPS mode, the load control signal on bus 132 would be dependent substantially only on the desired average transmit power level. This is because in the AMPS mode, the transmit signal is a constant envelope signal resulting from frequency modulation.

The envelope matching circuit 116 continuously generates a load control signal responsive to the detected amplitude and phase of the baseband I and Q signals, the desired average transmit power level, and the radiotelephone mode of operation. The load control signal thus represents, in accordance with the mode of operation selected, the dynamic amplitude and phase of the I and Q baseband signals as well as the average desired transmit power level of the radiotelephone 62. The load control signal can be either a digital signal, an analog waveform, or a combination of analog and digital waveforms that contains information about the instantaneous absolute power level of the transmitter. The envelope mapping circuit 116 can perform the envelope mapping function algorithmically or as a look-up table.

Thus, generally, a control circuit, here control block 70 (FIG. 3), converts user input information into a data stream and produces a signal representative of a desired amplitude modulation (AM) envelope. Transmitter circuitry (e.g. baseband circuitry 92 and RF circuitry 94 of FIG. 4) coupled to the control block 70 (FIG. 3) processes the data stream to form a constant envelope phase modulated (PM) signal. The amplifier system 90 is coupled to the transmitter circuitry. The load control signal causes the variable impedance network 120 to continuously present various impedances to the power amplifier output 124. The envelope mapping circuit 116 produces the load control signal responsive to the signal representative of the desired AM envelope. For a given modulation scheme, the user input information will have an associated AM envelope when a carrier signal is modulated by the user input information in accordance with the modulation scheme. The various impedances cause the desired AM envelope to be impressed upon the constant envelope PM signal at the output 122.

FIG. 4 shows that the transmitter 400 can optionally include an isolator 91 coupled to the output of the variable impedance network 120. The isolator presents a substantially constant impedance to the output of the variable impedance network 120. This will provide extra predictability to the various impedances that the variable impedance network 120 provides to the power amplifier output 124.

In addition, a method of transmitting user input information comprises converting the user input information into an input signal, modulating a carrier wave signal with the input signal to form a modulated signal having an amplitude modulation (AM) envelope, limiting the amplitude of the modulated signal to produce an amplitude limited signal, amplifying the amplitude limited signal with a power amplifier, and continuously varying a load impedance at an output of the power amplifier substantially in harmony with the AM envelope so as to restore the AM envelope onto the amplitude limited signal.

FIG. 4 also shows the transmitter 400 can optionally have a distortion control line 133 coupling the envelope matching circuit 116 to the IQ modulator 108. This distortion control line 133 optionally allows for the introduction of predistortion onto an input signal before applying the input signal to the power amplifier 124.

The variable impedance network 120 presents various impedances to the power amplifier output 124 to maximize power amplifier efficiency and to restore the AM envelope. Due to biasing of the power amplifier 118 and the various output loads presented, the power amplifier 118 operates at saturation/compression to provide for maximum power amplifier 118 efficiency. Operating at saturation can cause the power amplifier 118 to introduce distortion onto the RF input signal. In addition, the variable impedance network 120 may introduce some level of amplitude and phase distortion to the signal. With an a priori knowledge of this distortion, either through measurements, calculations, or both, pre-distortion can be impressed upon the signal to be amplified in order to account for the distortion resulting from the power amplifier 118 and/or the variable impedance network 120.

The envelope mapping circuit 116 also contains distortion control circuitry for generating the distortion control signal on distortion control line 133. The distortion control signal can be an analog signal or a digital signal. In addition, the distortion control circuitry can be in a different portion of the radiotelephone 62 rather than within the envelope mapping circuit 116. For example, the distortion control circuitry can be within the control block 70 (FIG. 3).

FIG. 4 shows the distortion control line 133 coupling the envelope mapping circuit 116 to the IQ modulator 108 so that circuitry within the IQ modulator 108 introduces the pre-distortion signal. Alternatively, the distortion control signal can be applied to a different portion of the transmitter 400 circuitry, such as baseband circuitry 92 (FIG. 4) or circuitry within control block 70 (FIG. 3). The pre-distortion could then be introduced via the baseband circuitry 92 or via circuitry within the control block 70 (FIG. 3).

Thus, the radiotelephone 62 has digital processing circuitry (either within the envelope mapping circuit 116 of FIG. 4, the control block 70 of FIG. 3, or elsewhere within the radiotelephone 62) for converting user input information to an input signal. The radiotelphone 62 also includes transmit circuitry (here baseband circuitry 92 and/or RF circuitry 94) coupling the digital processing circuitry to the input of the power amplifier 118 for amplifying, modulating, and limiting the input signal before applying the input signal to the signal amplifier (e.g. power amplifier 118). In addition, the radiotelephone 62 includes distortion control circuitry coupled to any of the digital processing circuitry, the transmit circuitry, and the envelope mapping circuit 116. The distortion control circuitry causes any of the digital processing circuitry and the transmit circuitry to introduce pre-distortion upon the input signal before applying the input signal to the power amplifier 118. The distortion control circuitry can be realized using a DSP, a microcontroller, or other circuitry.

The introduction of pre-distortion is generally known to those skilled in the art. As an example, see U.S. Pat. No. 5,113,414. Other methods and systems to introduce pre-distortion can be utilized as is known in the art.

FIG. 4 also shows the transmitter 400 can optionally include a signal quality detector 140 coupled to the power amplifier output 124. Signal quality control line 142 directs a signal quality indication to the envelope mapping circuit 116. The signal quality detector 140 measures the peak to average ratio of the RF signal produced at the power amplifier output 124.

The output of the signal quality detector is used by the envelope mapping circuit 116 to compensate for variances in circuitry in the RF path. For example, the power. amplifier 118 performance varies over temperature. The power amplifier performance 118 also varies from part to part within different radiotelephones. The variable impedance network 120 performance may also vary due to temperature variations and part variations. All of these variations must be accounted for by setting the operating point of the power amplifier 118 to account for worst case conditions. For example, the power amplifier 118 might be biased to have a higher quiescent current to maintain linearity over worst case temperature and part variation conditions than would otherwise be necessary if no performance variations were possible. Having to account for these worst case conditions means the power amplifier 118 may have to be biased to expend additional DC power to maintain linearity over possible worst case conditions.

The inclusion of the signal quality detector 140 helps account for performance variations and thereby allows the power amplifier 118 used within each radiotelephone to operate closer to saturation, thereby maximizing power amplifier efficiency. The signal quality detector 140 monitors the peak to average ratio of the RF signal. Alternatively, the signal quality detector 140 can measure the amount of adjacent channel power (ACP) that the radiotelephone 62 (FIG. 3) transmits. Further details on the measuring of adjacent channel power are described in a co-pending U.S. patent application entitled "OFF-CHANNEL LEAKAGE POWER MONITOR APPARATUS AND METHOD," Ser. No. 08/968,625, filed Nov. 12, 1997, assigned to the assignee of the present invention, the disclosure thereof incorporated by reference. The signal quality detector 140 sends an indication of the peak to average ratio via signal quality control line 142 to the envelope mapping circuit 116. The envelope mapping circuit 116 uses the signal quality indication to adjust the variable impedance network 120, and the variable impedance network 120 controls the impedances presented to the power amplifier output 124 to maintain a constant peak to average ratio in the RF signal.

Figure 5:
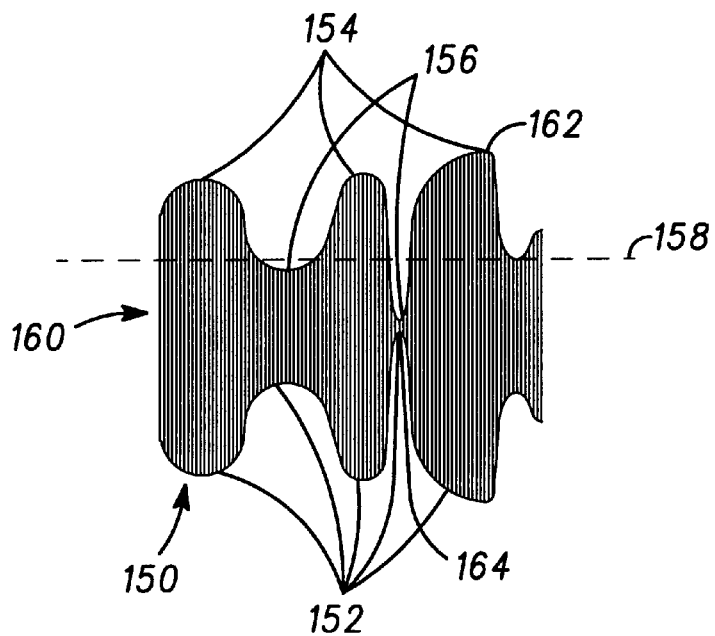
FIG. 5 shows the RF modulated signal produced by the amplifier system of FIG. 4.
Figure 6:
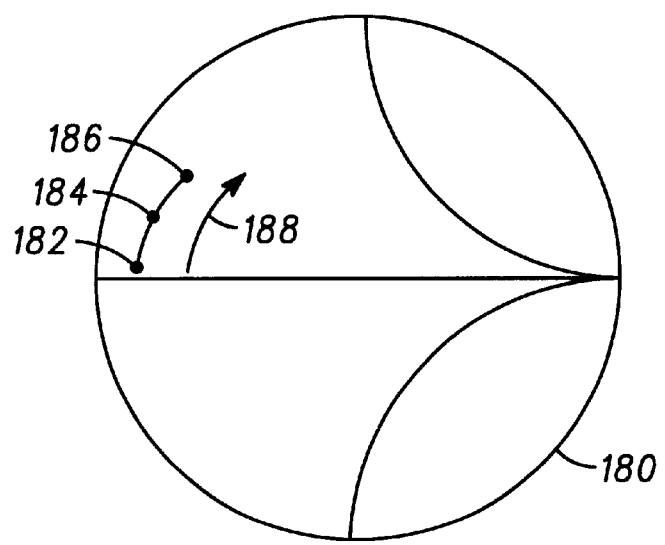
FIG. 6 is a Smith Chart showing three different optimum impedances to be presented to a power amplifier used in the amplifier system of FIG. 4 corresponding to three instantaneous power levels.

Varying the impedances presented to the power amplifier output 124 can be understood more with reference to FIGS. 5 and 6. FIG. 5 shows the RF modulated signal 150 that is produced at the output of the variable impedance network 120 (FIG. 4). The input signal to the power amplifier 118 (FIG. 4) is a signal having a substantially constant amplitude, and the RF modulated signal 150 (FIG. 5) is an amplified version of the input signal with the restored AM envelope 152. Due to the various linear modulation schemes, the amplitude of the AM envelope continuously varies and thus produces peaks 154 and valleys 156. The average transmit power level, as indicated by the dashed line 158, is in between the peaks 154 and the valleys 156. The modulation is carried by an RF carrier signal 160.

As discussed previously, the variable impedance network 120 (FIG. 4) is continuously adjusted to present a substantially optimum impedance to the power amplifier output 124 (FIG. 4) to simultaneously restore the AM envelope and to maximize the power amplifier efficiency for each excursion along the AM envelope.

FIG. 6 shows a Smith Chart showing three different optimum impedances to be presented to the power amplifier output 124 (FIG. 4) corresponding to three instantaneous power levels (e.g. three instantaneous excursions on the restored AM envelope). Thus, first impedance point 182, second impedance point 184, and third impedance point 186 represent impedances at a single carrier frequency but at different power levels at the power amplifier output 124. First impedance point 182 corresponds to peak power point 162 (FIG. 5), second impedance point 184 corresponds to average transmit power level (indicated by dashed line 158 of FIG. 5), and third impedance point 186 corresponds to minimum power point 164. By continuously varying the load impedance presented to the power amplifier output 124, the output power can be varied to restore the AM envelope, and the load impedance corresponding to the best power amplifier 118 efficiency can be continuously presented to the power amplifier 118 as the amplitude of the AM envelope 152 changes. The overall efficiency of the power amplifier 118 is thus increased.

Referring to FIGS. 5 and 6, the second impedance point 184 corresponds to average power point 163 (FIG. 5). If, due to temperature and/or part variations, a measured peak to average ratio is greater than a predetermined, desired, peak to average ratio, a different impedance is selected along the impedance set denoted by impedance points 182 through 186. A different impedance is selected by moving along the impedance set on the Smith chart in the direction shown by direction arrow 188. Thus, instead of using second impedance point 184 for a certain power level, the third impedance point 186 is used. Likewise, if the peak to average ratio is less than desired, a different impedance is selected by moving along a set of impedances in a direction opposite the direction arrow 188, as shown on the Smith Chart 180 of FIG. 6.

The signal quality detector can be realized with diode detection circuitry and resistor-capacitor networks. FIG. 4 shows the signal quality detector sending a signal quality indication via signal quality control line 142 directly to the envelope mapping circuit 116. Alternatively, the signal quality indication can be coupled to other circuitry for processing, such as control block 70 (FIG. 3), and then coupled to envelope mapping circuit 116. Still further, analog circuitry such as operational amplifier circuitry (not shown) can receive the load control signal present on bus 132 and the signal quality indication present on signal quality control line 142. The analog circuitry can then process the two signals and generate a modified load control signal that is applied to the variable impedance network 120.

Figure 7:
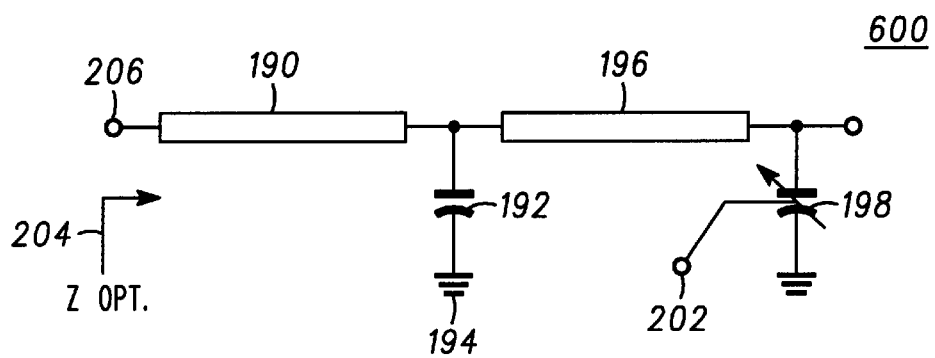
FIG. 7 shows a first embodiment variable impedance network that can be used to present various impedances to the power amplifier.

FIG. 7 shows a first embodiment variable impedance network 600 that can be used to present various impedances to the power amplifier 118 (FIG. 4). The variable impedance network 600 includes first transmission line 190, fixed shunt capacitor 192 coupled to ground potential 194, second transmission line 196, and at least one variable element 198 coupled to ground potential 194. The variable element 198 can be selected from the group consisting of a varactor diode and a voltage variable capacitor. The load control signal is applied to input 202 as a voltage to vary the capacitance of the variable element 198. Arrow 204 shows that the impedance presented at input 206 is maintained to be substantially the optimum impedance for the power amplifier 118 (FIG. 4) for the various output power levels.

Other configurations of the variable impedance network 600 can be envisioned. For example, additional elements can be included, such as lumped element or distributed element inductors, additional transmission lines and capacitors, and additional variable elements.

Figure 8:
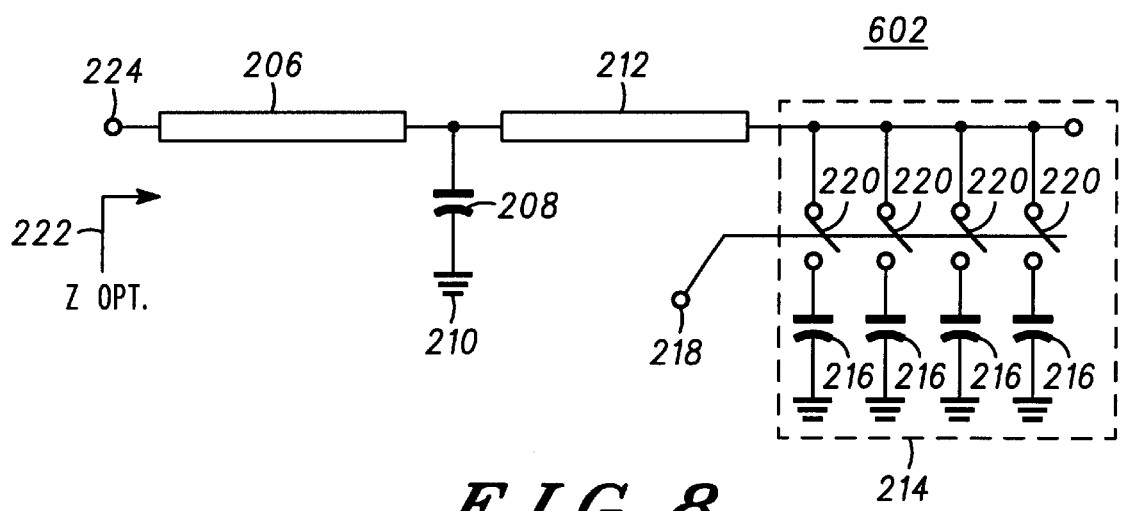
FIG. 8 shows a second embodiment variable impedance network.

FIG. 8 shows a second embodiment variable impedance network 602. The variable impedance network 602 includes first transmission line 206, a fixed shunt capacitor 208 coupled to ground potential 210, second transmission line 212, and at least one variable element 214 coupled to ground potential 210. The variable element comprises a plurality of capacitors 216 alternatively coupled and uncoupled to the power amplifier output 124 using PIN diodes or micro-mechanical switches. The load control signal is applied to input 218 to open and close a plurality of switches 220 coupling the plurality of capacitors 216 to the power amplifier output 124. Arrow 222 shows that the impedance presented at input 224 is maintained to be substantially the optimum impedance for the power amplifier 118 (FIG. 4) for the various output power levels.

Thus, the variable impedance network has at least one variable element. The variable element can be selected from the group consisting of a varactor diode, a voltage variable capacitor, and a plurality of capacitors alternatively coupled and uncoupled to the output of the signal amplifier using micro-electromechanical switches or PIN diodes.

Other configurations of the variable impedance network 602 can be envisioned without the use of the inventive faculty. For example, additional elements can be included, such as lumped element or distributed element inductors, additional transmission lines and capacitors, and additional variable elements. A combination of the variable impedance network 600 and the variable impedance network 602 could be used to increase the range of obtainable impedances. In addition, the load control signal can comprise multiple signals to separately control different variable impedance elements.

Figure 9:
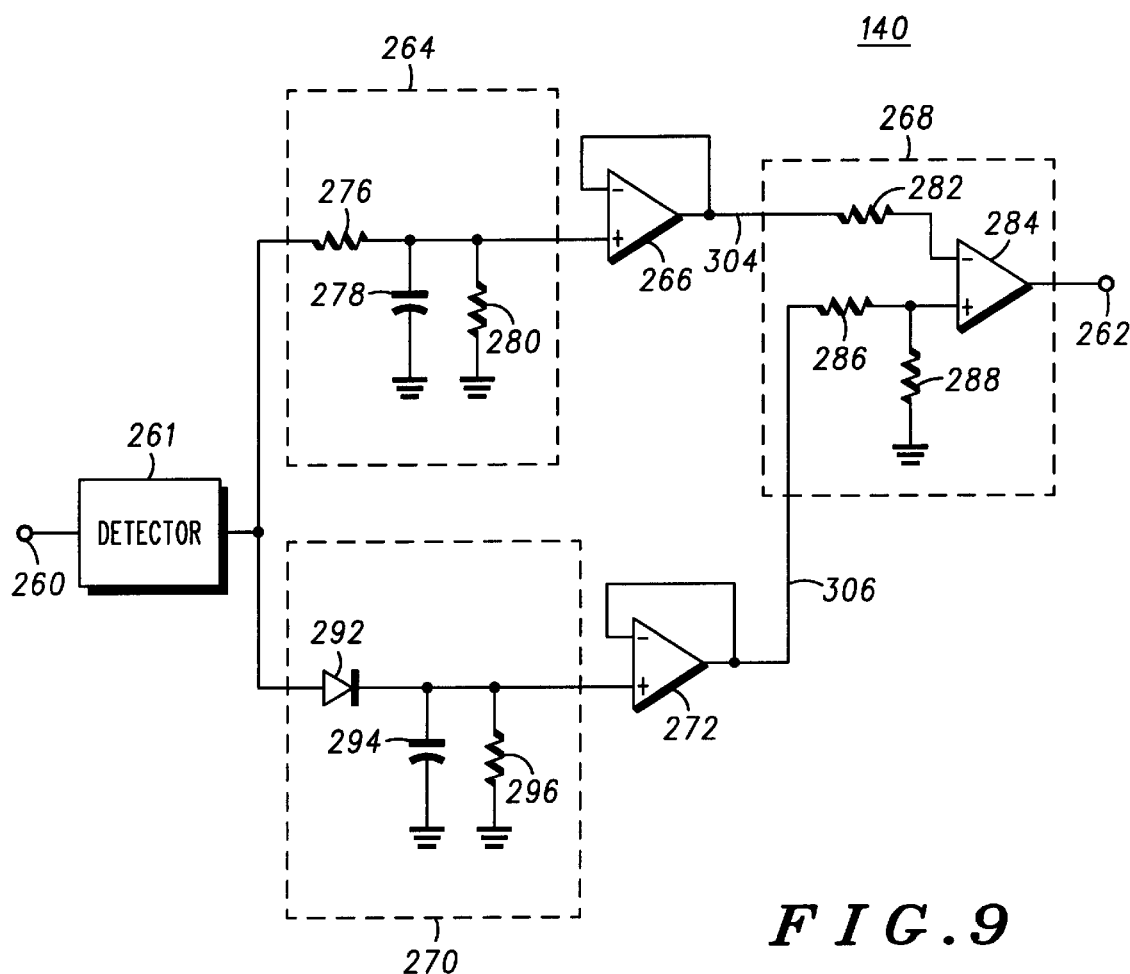
FIG. 9 is an example embodiment of a signal quality detector used in conjunction with the amplifier system of FIG. 4.

FIG. 9 is an example embodiment of a signal quality detector 140 used in conjunction with the amplifier system 90. The signal quality detector 140 includes a conventional envelope detector 261, an averaging circuit 264, a first op-amp 266, a difference circuit 268, a peak detector 270, and a second op-amp 272.

The averaging circuit 264 includes a series resistor 276 coupled to a shunt capacitor 278 and a shunt resistor 280. The peak detector 270 includes a diode detector 292 coupled to a shunt capacitor 294 and a shunt resistor 296.

The difference circuit 268 has a first input 304 coupled through a series resistor 282 to the negative input of an op-amp 284. A second input 306 is coupled through a series resistor 286 and a shunt resistor 288 to a positive input of the op-amp 284. The output of the op-amp 284 is the signal quality detector output 262.

A sample of the output signal is applied to signal quality detector input 260, and the conventional envelope detector 261 produces a detected baseband signal with an AM envelope. The detected baseband signal is applied to the averaging circuit 264 and the peak detector circuit 270. The peak of the detected baseband signal is produced by the peak detector 270, whereas an average value of the detected baseband signal is produced by the averaging circuit 264.

First op-amp 266 and second op-amp 272 are voltage followers to provide isolation between the averaging circuit 264 and the difference circuit 268 and between the peak detector 270 and the difference circuit 268. The buffered average value is applied to first input 304 and the buffered detected peak of the signal is applied to second input 306.

The difference between the peak and average signal is produced at output 262, which is then sampled by an analog-to-digital (A-D) converter (not shown). The A-D converter can be within the envelope mapping circuit 116 (FIG. 4), within the control block 70 (FIG. 3), or elsewhere within the radiotelephone 62. The sampled difference is compared to a correlation table that gives the value of the peak-to-average ratio for the envelope. This sampling takes place at a very low rate since the sampling is of an averaged value. The envelope mapping circuit 116 adjusts the load impedance presented by the variable impedance network 120 until the monitored peak-to-average ratio is substantially equal to a pre-determined value.

In an alternate embodiment, the limiting amplifier 109 (FIG. 4) removes only a portion of the AM envelope of the modulated signal to form a processed signal. This can be done to reduce the range of impedances presented to the power amplifier output 124 necessary to completely restore the AM envelope.

Thus, the limiting amplifier 109 does not completely remove the AM envelope of the modulated signal. As an example, only the top 8 dB of the AM envelope is removed by the limiting amplifier 109. The variable impedance network 120 then continuously presents different impedances to the power amplifier output to restore the AM envelope.

Much of the high frequency amplitude information is contained in the valleys (e.g. minimums) 156 (FIG. 5) of the AM envelope. By using the AMPLIFIER SYSTEM 242 system to add only a portion of the AM envelope, the bandwidth of the load control signal can be significantly reduced. In addition, by using the AMPLIFIER SYSTEM 242 system to add only the top 8 dB of the AM, the power amplifier performance can be improved at the higher output powers, where the power amplifier draws the most current.

FIG. 4 shows that the VGA 110 can optionally be controlled by the envelope mapping circuit 116 via line 135. The power amplifier has a limited amount of RF gain so that the combination with the variable impedance network 120 may not have enough dynamic range to adequately impress an AM envelope upon the signal appearing at output 122. Therefore, the gain of the VGA 110 can be adjusted in harmony with the desired AM envelope to impress at least a portion of the AM envelope upon the signal appearing at the output 122.

Figure 10:
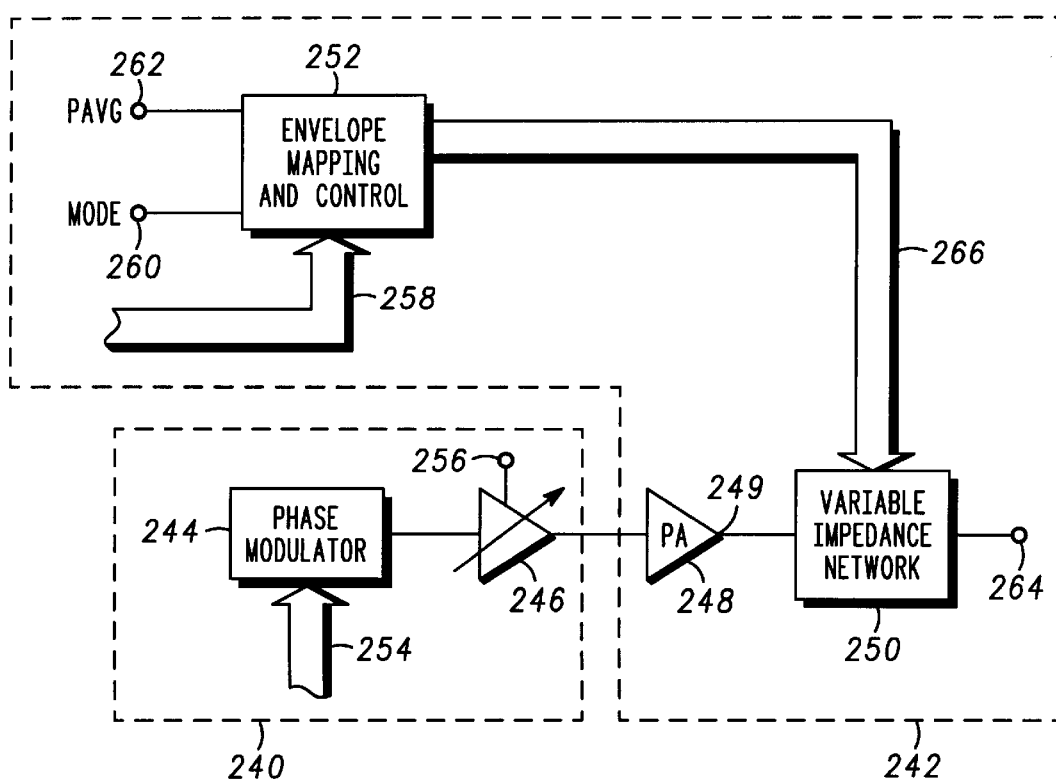
FIG. 10 is a block diagram exemplifying an alternate embodiment amplifier system.

FIG. 10 shows a block diagram of a portion of a transmitter 700 incorporating an alternate embodiment amplifier system 242. The transmitter 700 includes transmitter circuitry 240 coupled to the Amplifier system 242

The transmitter circuitry 240 includes a phase modulator 244 coupled to a variable gain element, here variable gain amplifier (VGA) 246. The amplifier system 242 includes power amplifier 248 coupled to a variable impedance network 250, and an envelope mapping circuit 252 coupled to the variable impedance network 250.

The control block 70 of the radiotelephone 62 (FIG. 3) generates a phase signal that carries the desired phase information of the information signal that is to be transmitted. Thus, control block 70 contains phase mapping circuitry to receive user input information and map that to a constant envelope phase signal. The mapping function can be performed algorithmically in software, as a look up table, or as a combination of hardware and software as is known in the art.

The phase signal is applied over line 254 to the phase modulator 244. The phase modulator then generates a constant envelope phase modulated (PM) signal. Many methods of implementing the phase modulator 244 are known in the art. For example, one method is to use an frequency modulated (FM) voltage controlled oscillator (VCO) (not shown) followed by buffer amplifiers (not shown) to provide the appropriate power level to drive the power amplifier 248. The VCO can generate an RF transmit signal directly, or additional up-conversion mixers(s) can be incorporated into the transmitter circuitry 240 to up-convert an intermediate frequency (IF) signal to RF. The constant envelope PM signal is applied to VGA 246.

The VGA 246 provides preliminary signal amplification and provides power control. The control block 70 (FIG. 3) generates an AOC signal applies the AOC signal to VGA control input 256. The VGA adjusts its gain in response to the AOC signal.

The constant envelope PM signal is then applied to power amplifier 248 as an input signal. The power amplifier 248 amplifies the input signal to a final transmit power level to produce an amplified signal. The variable impedance network 250 is coupled to receive the amplified signal and the load control signal. The load control signal on bus 266 causes the variable impedance network 250 to continuously present various impedances to the power amplifier output 249. The load control is performed as follows.

An indication of the desired average transmit power is applied to the envelope mapping circuit 252 via power level input 262, and an indication of the mode of operation is applied to the envelope mapping circuit 252 via mode input 260. In addition, a signal representative of the user input information is applied to the envelope mapping circuit 252 via bus 258. All three indication signals can be generated by the control block 70 (FIG. 3).

The envelope mapping circuit 252 produces a load control signal on bus 266 that is a function of the indication of the desired average transmit power, the mode of operation, and the signal representative of the user input information. The load control signal can be generated algorithmically or by a look up table in software, in an ASIC, or using a combination of hardware and software.

The amplitude of the input signal to the power amplifier 248, which is a constant envelope signal, has its amplitude varied by the combination of the power amplifier 248 and the variable impedance network 250. An AM envelope is impressed upon the output signal present at output 264. Thus, while prior art EER systems impress AM onto the output of a power amplifier by varying either the power amplifier supply voltage or the bias voltage, here AM is impressed upon the PM signal by continuously varying the load impedances presented to the power amplifier output 249.

By successively selecting the appropriate load, different amplitude functions can be impressed upon the output signal present at output 264. By adding the amplitude modulation after power amplifier 248 amplification, the power amplifier can operate in a more efficient mode. Without the Amplifier system 242 and when linear modulation is present, the power amplifier is operated in Class A or AB such that the input signal having an AM envelope is faithfully reproduced at the power amplifier output (e.g. power amplifier operates in a linear mode). This is not the most efficient mode of operation for the power amplifier. With the amplifier system, a constant envelope signal is applied as an input signal to the power amplifier, and the power amplifier does not have to provide linear amplification. Thus, the power amplifier can operate in a more efficient mode, such as Class C.

Thus, generally, a control circuit, here control block 70 (FIG. 3), converts user input information into a data stream and produces a signal representative of a desired amplitude modulation (AM) envelope. Transmitter circuitry 240 coupled to the control block 70 (FIG. 3) processes the data stream to form a constant envelope phase modulated (PM) signal. The amplifier system 242 is coupled to the transmitter circuitry 240. The load control signal causes the variable impedance network 250 to continuously present various impedances to the power amplifier output 249, and the envelope mapping circuit 252 produces the load control signal responsive to the signal representative of the desired AM envelope. The various impedances cause the desired AM envelope to be impressed upon the constant envelope PM signal at the output 264.

As discussed with FIG. 4, optional features can be added to the transmitter 700 and the Amplifier system 242. For example, an isolator can be placed at the output 264. In addition, pre-distortion can be added. Finally, a signal quality detector can be placed at the output 264 to constantly monitor the output signal to maintain a predetermined peak-to-average ratio.

Figure 11:
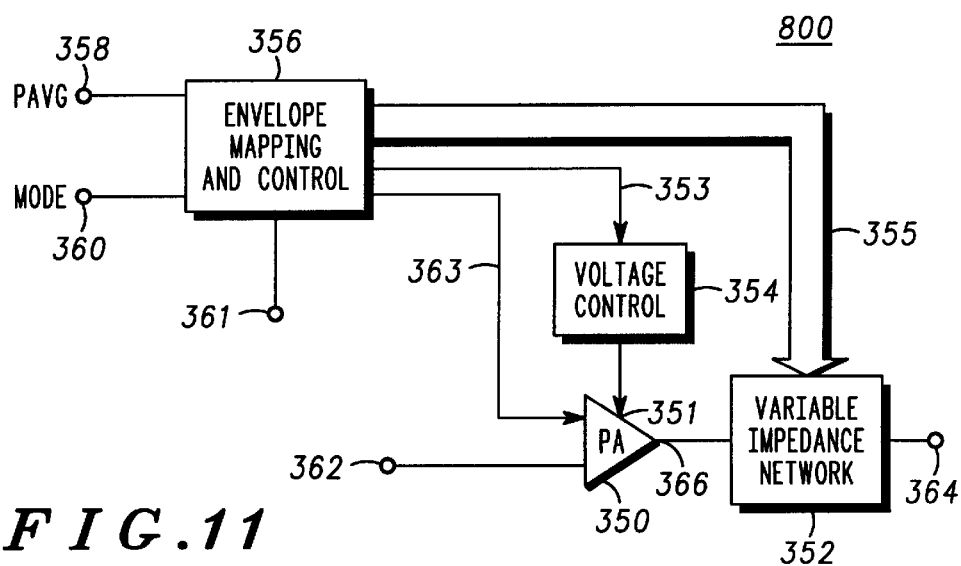
FIG. 11 is a block diagram of another alternate embodiment amplifier system.

FIG. 11 shows another alternate embodiment AMPLIFIER SYSTEM 242 system 800. The AMPLIFIER SYSTEM 242 system 800 includes a power amplifier 350 coupled to a variable impedance network 352, and an envelope mapping and control circuit 356 coupled to the variable impedance network 352 and coupled through a voltage control circuit 354 to a supply port 351 of the power amplifier 350.

The control block 70 (FIG. 3) converts user input information into an input signal and generates an indication of a desired average transmit power. Transmitter circuitry (e.g. baseband circuitry 92 and RF circuitry 94 of FIG. 4 or transmitter circuitry 240 of FIG. 10 ) processes the input signal to form a substantially constant envelope signal. The power amplifier 350 receives the substantially constant envelope signal and produces an amplified signal at the power amplifier output 366. The variable impedance network 352 is coupled to receive the amplified signal and a load control signal present on bus 355. The load control signal causes the variable impedance network 352 to continuously present various impedances to the power amplifier output 366.

The envelope mapping and control circuit 356 receives the indication of the desired average transmit power at input 358, a mode indication at input 360, and a representation of the user input information at input 361 to produce the load control signal on bus 355. The load control signal is essentially the user input information mapped to an AM envelope associated with a chosen modulation scheme.

The envelope mapping and control circuit 356 also produces a supply voltage control signal on line 353 that is directly related to the indication of the average transmit power. The voltage control circuit 354 receives the supply voltage control signal and produces a supply voltage that is directly related to the supply voltage control signal. The supply voltage is applied to the supply port 351 of the power amplifier 350.

In many applications, the transmitted output power is at the lower end of the available transmission power levels. For example, in the IS-95 CDMA cellular telephone system, the transmitted power range is +24 dBm to approximately −50 dBm. The portable radiotelephone statistically spends more time transmitting at the lower power levels than at the higher power levels.

If the supply voltage to the power amplifier is held substantially constant over the entire transmit power range, a sacrifice in power amplifier efficiency results. Lowering the supply voltage to the power amplifier 350 during lower transmit power levels will increase the overall efficiency of the system.

Thus envelope mapping and control circuit 356 produces a supply voltage control signal on supply control line 353 in response to the signal at input 358. The supply voltage to the power amplifier 350 then varies with the desired average transmit power level. For example, as the transmit power increases towards the maximum value, the supply voltage at supply port 351 increases to its maximum voltage.

The voltage control circuit 354 is a linear or switching regulator as is known in the art. Since changing the supply voltage of the power amplifier 350 can affect the power amplifier 350 gain, phasing can be performed at the factory to compensate and factor in the changes in gain as a function of supply voltage.

For even more efficiency improvements, the DC currents in the power amplifier 350 can be adjusted responsive to the desired average transmit power levels. For example, as the average transmit power level is decreased, less current is needed in the power amplifier 350. Therefore, the envelope mapping and control circuit 356 produces a bias control voltage on line 363 that is directly proportional to the desired average transmit power. The bias control voltage is applied to the power amplifier 350 to cause a bias current of the power amplifier 350 to vary in direct proportion to the desired average transmit power.

If the power amplifier 350 is a FET amplifier, the bias control voltage can be the gate voltage. If a bipolar device is used, the bias control voltages can be, for example, a base-emitter voltage.

As discussed with FIG. 4, optional features can be added to the AMPLIFIER SYSTEM 242 system 702. For example, an isolator can be placed at the output 266. In addition, pre-distortion can be added. Finally, a signal quality detector can be placed at the output to constantly monitor the output signal to maintain a predetermined peak-to-average ratio.

The previous description of the preferred embodiments are provided to enable any person skilled in the art to use the method of or make the apparatus for activating a spread-spectrum radiotelephone receiver. Various modifications to these embodiments will be readily apparent to those skilled in the art, and the generic principles defined herein may be applied to other embodiments without the use of the inventive faculty. For example, the AM envelope can result from a modulation scheme used in a cellular telephone system selected from the group consisting of a time division multiple access (TDMA) system, a code division multiple access (CDMA) system, and a combination TDMA-CDMA system. Alternatively, the AMPLIFIER SYSTEM 242 system can be used in any radio transmission system having a modulation scheme that necessitates linear amplification or that produces an AM envelope on the carrier signal.

The AMPLIFIER SYSTEM 242 system provides for an efficient amplification system of a RF signal. The AMPLIFIER SYSTEM 242 system provides a cost-effective method of and system for amplifying a modulated signal having an AM envelope. Use in a radiotelephone provides for significant current savings at a lower cost compared to prior art systems. With the increased complexity of future generation radiotelephones, the AMPLIFIER SYSTEM 242 system used in a radiotelephone will provide a significant performance advantage over conventional radiotelephones.

We claim:

1. An amplifier system comprising:
   a signal amplifier having an input and an output, the input for receiving a substantially constant envelope input signal;
   a variable impedance network coupled to the output of the signal amplifier, the variable impedance network for presenting various impedances to the output of the signal amplifier responsive to a load control signal to impress upon the substantially constant envelope input signal a desired amplitude modulation (AM) envelope to produce an output signal having an AM envelope; and
   an envelope mapping circuit coupled to the variable impedance network, the envelope mapping circuit for producing the load control signal responsive to the desired AM envelope.

2. The amplifier system as in claim 1 wherein the desired AM envelope comprises modulation resulting from user input information.

3. The amplifier system as in claim 2 wherein the envelope mapping circuit receives an indication of a desired average power level and produces the load control signal responsive to the indication of the desired AM envelope and the indication of the desired average power level.

4. The amplifier system as in claim 1 further comprising:
transmit circuitry coupled to the input of the signal amplifier, the transmit circuitry for amplifying and modulating an input signal to produce the substantially constant envelope input signal; and
distortion control circuitry coupled to the envelope mapping circuit and the transmit circuitry, the distortion control circuitry for generating a distortion control signal and coupling the distortion control signal to the transmit circuitry,
wherein the distortion control signal causes the transmit circuitry to impress predistortion upon the substantially constant envelope input signal before applying the substantially constant envelope input signal to the signal amplifier.

5. The amplifier system as in claim 1 further comprising a signal quality detector coupled to the output of the signal amplifier and coupled to the envelope mapping circuit, the signal quality detector for monitoring a peak-to-average ratio of the output signal and producing an indication of the peak-to-average ratio, wherein the envelope mapping circuit generates the load control signal responsive to the indication of the peak-to-average ratio, thereby causing the variable impedance network to present the various impedances to the output of the signal amplifier to cause the signal amplifier to produce the output signal with a substantially constant, predetermined, peak-to-average ratio.

6. The amplifier system as in claim 1 further comprising a signal quality detector coupled to the output of the signal amplifier and coupled to the envelope mapping circuit, the signal quality detector for monitoring an adjacent channel power (ACP) of the output signal and producing an indication of the ACP, wherein the envelope mapping circuit produces the load control signal responsive to the indication of the ACP, thereby causing the variable impedance network to present the various impedances to the output of the signal amplifier to cause the signal amplifier to generate less than a predetermined level of ACP.

7. A transmitter for transmitting a modulated information signal, the transmitter comprising:
a control circuit for converting user input information into a data stream and for producing a signal representative of a desired amplitude modulation (AM) envelope;
transmitter circuitry coupled to the control circuit for processing the data stream to form a constant envelope phase modulated (PM) signal; and
an amplifier system coupled to the transmitter circuitry, the amplifier system including,
a power amplifier coupled to receive the constant envelope PM signal,
a variable impedance network coupled to receive a load control signal and coupled to an output of the power amplifier, the load control signal causing the variable impedance network to present various impedances to the output of the power amplifier, and
an envelope mapping circuit coupled to the variable impedance network and the control circuit, the envelope mapping circuit to produce the load control signal responsive to the signal representative of the desired AM envelope,
wherein the various impedances cause the desired AM envelope to be impressed upon the constant envelope PM signal at an output of the variable impedance network.

8. The transmitter as in claim 7 further comprising a variable gain element coupled to an input of the power amplifier, the variable gain element to adjust an amplitude of the constant envelope PM signal in response to an indication of a desired average output power, the control circuit to generate the indication of the desired average output power, wherein the envelope mapping circuit produces the load control signal responsive to the indication of the desired average output power.

9. The transmitter as in claim 8 further comprising an isolator coupled to the output of the variable impedance network to provide a substantially constant impedance to the output of the variable impedance network.

10. A method of transmitting user input information comprising:
converting the user input information into a data stream;
producing a substantially constant amplitude signal;
amplifying the substantially constant amplitude signal with a power amplifier; and
varying a load impedance presented to an output of the power amplifier according to a desired amplitude modulation (AM) envelope to amplitude modulate the output of the power amplifier.

11. The method of claim 10 further comprising generating a load control signal responsive to the desired AM envelope, wherein varying the load impedance is responsive to the load control signal.

12. A method of transmitting user input information comprising:
converting the user input information into a data stream;
phase modulating a carrier signal with the data stream to form a constant envelope phase modulated (PM) signal;
generating a load control signal responsive to the data stream;
amplifying the constant envelope PM signal with a power amplifier; and
presenting various impedances to an output of the power amplifier responsive to the load control signal to impress upon the constant envelope PM signal amplitude modulation representative of the data stream and a chosen modulation scheme.

13. A method of transmitting user input information comprising:
converting the user input information into an input signal;
modulating a carrier wave signal with the input signal to form a modulated signal having an amplitude modulation (AM) envelope;
removing at least a portion of the AM envelope to form a processed signal;
amplifying the processed signal with a power amplifier; and
varying a load impedance at an output of the power amplifier to restore the at least a portion of the AM envelope.

14. A radiotelephone comprising:
a user interface for receiving input information and presenting transmitted data;
a control circuit for controlling the radiotelephone, the control circuit for converting the input information into an input signal;
a receiver coupled to the control circuit and the user interface, the receiver for receiving the transmitted data and directing the transmitted data to the user interface;
a synthesizer for generating a radio frequency (RF) carrier signal; and
a transmitter coupled to the control circuit, the user interface, and the synthesizer, the transmitter coupled to receive the input signal and the RF carrier signal, the transmitter for modulating the RF carrier signal with the input signal to form a modulated input signal having an amplitude modulation (AM) envelope, the transmitter having a load envelope elimination and restoration power amplifier (LEER PA) system including, an amplitude limiting element coupled to receive the modulated input signal to remove at least a portion of the AM envelope from the modulated input signal to form a limited signal, a power amplifier coupled to receive the limited signal to produce an amplified signal at an output of the power amplifier, a variable impedance network coupled to receive the amplified signal and a load control signal, the load control signal causing the variable impedance network to present various impedances to the output of the power amplifier responsive to amplitude variations of the modulated input signal having the AM envelope, and an envelope mapping circuit coupled to the variable impedance network and the control circuit, the envelope mapping circuit for producing the load control signal indicative of the amplitude variations of the modulated input signal having the AM envelope.

15. The radiotelephone as in claim 14 further comprising:

average transmit power control circuitry coupled to the control circuit, the envelope mapping circuit, and the transmitter, the average transmit power control circuitry for generating an automatic output control (AOC) signal; and a variable gain element coupled to receive the AOC signal and coupled to the power amplifier to adjust an average amplitude of the modulated input signal in response to the AOC signal, wherein the envelope mapping circuit produces the load control signal responsive to the AOC signal.

16. The radiotelephone as in claim 15 further comprising an isolator coupled to an output of the variable impedance network to provide a substantially constant impedance to the output of the variable impedance network.

17. A transmitter for transmitting a modulated information signal, the transmitter comprising:

a control circuit for converting user input information into an input signal and for providing an indication of a desired average transmit power;

transmitter circuitry coupled to the control circuit for processing the input signal to form a substantially constant envelope signal; and an amplifier system coupled to the transmitter circuitry, the amplifier system including, a power amplifier coupled to receive the substantially constant envelope signal to produce an amplified signal at an output of the power amplifier, a variable impedance network coupled to receive the amplified signal and a load control signal, the load control signal causing the variable impedance network to present various impedances to the output of the power amplifier, an envelope mapping circuit coupled to the variable impedance network, the control circuit, and the transmitter circuitry, the envelope mapping circuit to produce the load control signal responsive to the indication of the desired average transmit power and the user input information, the envelope mapping circuit to produce a supply voltage control signal related to the indication of the desired average transmit power, and a voltage control circuit for receiving the supply voltage control signal, producing a supply voltage responsive to the supply voltage control signal, and applying the supply voltage to the power amplifier.

18. A transmitter for transmitting a modulated information signal, the transmitter comprising:

a control circuit for converting user input information into an input signal and for providing an indication of a desired average transmit power;

transmitter circuitry coupled to the control circuit for processing the input signal to form a substantially constant envelope signal; and an amplifier system coupled to the transmitter circuitry, the amplifier system including, a power amplifier coupled to receive the substantially constant envelope signal to produce an amplified signal at an output of the power amplifier, a variable impedance network coupled to receive the amplified signal and a load control signal, the load control signal causing the variable impedance network to present various impedances to the output of the power amplifier, and an envelope mapping circuit coupled to the variable impedance network, the control circuit, and the transmitter circuitry, the envelope mapping circuit to produce the load control signal responsive to the indication of the desired average transmit power and the user input information, the envelope mapping circuit to produce a bias control voltage proportional to the indication of the desired average transmit power, wherein the bias control voltage is applied to the power amplifier to cause a bias current of the power amplifier to vary in response to the indication of the desired average transmit power.

19. A transmitter for transmitting a modulated information signal, the transmitter comprising:

a control circuit for converting user input information into a data stream;

transmitter circuitry coupled to the control circuit for processing the data stream to produce a signal representative of a desired amplitude modulation (AM) envelope and to produce a constant envelope input signal; and an amplifier system coupled to the transmitter circuitry, the amplifier system including, a power amplifier coupled to receive the constant envelope input signal, a variable impedance network coupled to receive a load control signal and coupled to an output of the power amplifier, the load control signal causing the variable impedance network to present various impedances to the output of the power amplifier, and an envelope mapping circuit coupled to the variable impedance network and the control circuit, the envelope mapping circuit to produce the load control signal responsive to the signal representative of the desired AM envelope, wherein the various impedances cause the desired AM envelope to be impressed upon the constant envelope input signal at an output of the variable impedance network.

20. The transmitter as in claim 19 wherein the envelope mapping circuit is a portion of the control circuit.

* * * * *